United States Patent
Murai et al.

(10) Patent No.: US 7,473,853 B2
(45) Date of Patent: Jan. 6, 2009

(54) CIRCUIT DEVICE

(75) Inventors: Makoto Murai, Mizuho (JP); Ryosuke Usui, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 322 days.

(21) Appl. No.: 11/362,516

(22) Filed: Feb. 27, 2006

(65) Prior Publication Data

US 2006/0204733 A1 Sep. 14, 2006

(30) Foreign Application Priority Data

Feb. 28, 2005 (JP) ............................. 2005-055002

(51) Int. Cl.
*H05K 1/16* (2006.01)

(52) U.S. Cl. ...................... 174/260; 174/262

(58) Field of Classification Search .................. 174/254, 174/255, 256, 260, 261, 262

See application file for complete search history.

(56) References Cited

U.S. PATENT DOCUMENTS 4,965,660 A * 10/1990 Ogihara et al. .............. 257/717
5,834,101 A * 11/1998 Hayashi ....................... 428/209
6,291,880 B1 * 9/2001 Ogawa et al. ................ 257/723
6,696,643 B2 * 2/2004 Takano ........................ 174/520
7,145,231 B2 * 12/2006 Hasebe et al. ............... 257/712
2003/0085058 A1 * 5/2003 Komatsu et al. ............. 174/264

FOREIGN PATENT DOCUMENTS

JP 8-288605 A 11/1996

* cited by examiner

*Primary Examiner*—Ishwar (I. B.) Patel
(74) *Attorney, Agent, or Firm*—McDermott Will & Emery LLP

(57) ABSTRACT

The present invention provides a circuit device capable of controlling deformation of a circuit device while preventing an insulating layer from peeling from a substrate. The circuit device includes a substrate, an insulating layer formed on the substrate, a filler filled into the insulating layer, a conductive layer formed on the insulating layer, and a circuit element formed on the conductive layer, wherein an average particle diameter of the filler filled into the insulating layer is controlled so that a Young's modulus of a part of the insulating layer on a substrate side can be smaller than a Young's modulus of a part of the insulating layer on an opposite side relative to the substrate side.

20 Claims, 11 Drawing Sheets

CIRCUIT DEVICE

BACKGROUND OF THE INVENTION

1. Field of the Invention

The present invention relates to a circuit device, and more particularly, it relates to a circuit device comprising a circuit element.

2. Description of the Related Art

In a circuit device included in an electronic instrument or the like, the exothermic density per unit volume has recently been increased due to downsizing densification and multi-functionalization. In recent years, therefore, a metal substrate having high heat releasability has been employed as the substrate for this type of circuit device so that circuit elements such as an IC (integrated circuit) and an LSI (large-scale integrated circuit) are mounted on the metal substrate, as disclosed in Japanese Patent Laying-Open No. 8-288605 (1996), for example. A structure obtained by forming a hybrid IC (integrated circuit) on a metal substrate is also known in general. The term "hybrid IC" denotes a circuit device obtained by collectively integrating circuit elements such as IC chips, capacitors, resistors etc. onto a single substrate.

FIG. 22 is a sectional view schematically showing the structure of a conventional circuit device disclosed in the aforementioned Japanese Patent Laying-Open No. 8-288605. Referring to FIG. 22, a resin layer 102 functioning as an insulating layer containing silica ($SiO_2$) added as a filler is formed on a metal substrate 101 of aluminum (Al) in the conventional circuit device. An IC chip 104 is mounted on a prescribed region of the resin layer 102 through a bonding layer 103 of resin. Metal wires 105 of copper are formed on regions of the resin layer 102 separated from ends of the IC chip 104 at prescribed intervals through the bonding layer 103. The metal wires 105 and the metal substrate 101 are insulated from each other through the resin layer 102. The metal wires 105 and the IC chip 104 are electrically connected with each other through wires 106.

In the conventional circuit device shown in FIG. 22 the metal substrate 101 of aluminum is employed while the IC chip 104 is mounted on the metal substrate 101 through the resin layer 102, so that a large quantity of heat generated from the IC chip 104 can be released through the metal substrate 101.

However, the conventional circuit device shown in FIG. 22, wherein a thermal expansion coefficient of the resin layer 102 is smaller than a thermal expansion coefficient of the metal substrate 101, includes a problem, that is, the metal substrate 101 under the resin layer 102 is deformed in such a manner that it is warped when the metal substrate 101 expands due to the heat generated in the IC chip 104. As a result, the circuit device is disadvantageously deformed.

As a possible solution for the foregoing problem, a rigidity (Young's modulus) of the entire resin layer 102 can be increased so that the deformation of the metal substrate 101 under the resin layer 102 is controlled. However, when the rigidity (Young's modulus) of the entire resin layer 102 increased, a tangential stress generated between the metal substrate 101 and the resin layer 102 is accordingly increased when the metal substrate 101 expands due to the heat generated in the IC chip 104. As a result, the resin layer 102 is unfavorably easily peeled from the metal substrate 101.

SUMMARY OF THE INVENTION

Therefore, the present invention is made in order to solve the foregoing problems, and a main object thereof is to provide a circuit device capable of controlling deformation of a circuit device while preventing an insulating layer from peeling from a substrate.

In order to achieve the foregoing object, a circuit device according to an aspect of the present invention includes a substrate, an insulating layer formed on the substrate, a filler filled into the insulating layer, a conductive layer formed on the insulating layer, and a circuit element formed on the conductive layer, wherein an average particle diameter of the filler filled into the insulating layer is controlled so that a Young's modulus of a part of the insulating layer on a substrate side can be smaller than a Young's modulus of a part of the insulating layer on an opposite side relative to the substrate side.

In the circuit device according to the aspect, wherein the average particle diameter of the filler filled into the insulating layer is controlled so that the Young's modulus of the part of the insulating layer on the substrate side can be smaller than the Young's modulus of the part of the insulating layer on the opposite side relative to the substrate side, a rigidity of the part of the insulating layer on the substrate side can be smaller than a rigidity of the part of the insulating layer on the opposite side relative to the substrate side. Thereby, in such a situation that the insulating layer formed on the substrate is pulled by the substrate when the substrate expands due to a heat generated in the circuit element, a tangential stress generated between the substrate and the insulating layer can be reduced since the part of the insulating layer having the smaller Young's modulus (rigidity) is deformed in such a manner that it is stretched together with the substrate. As a result, the insulating layer can be prevented from peeling from the substrate. Further, the substrate under the insulating layer can be prevented from warping when the substrate expands due to the heat generated in the circuit element since the Young' modulus (rigidity) of the part of the insulating layer on the opposite side relative to the substrate side is large. Thereby, the deformation of the circuit device can be controlled.

In the circuit device according to the aspect, the insulating layer is constituted from a single layer, and the Young's modulus of the part of the one-layer insulating layer on the substrate side may be smaller than the Young's modulus of the part of the one-layer insulating layer on the opposite side relative to the substrate side. According to the structure, the tangential stress generated between the substrate and the insulating layer can be reduced by the part of the one-layer insulating layer on the substrate side having the smaller Young's modulus (rigidity), and further, the substrate under the insulating layer can be prevented from warping by the part of the one-layer insulating layer on the opposite side relative to the substrate side having the larger Young's modulus (rigidity).

In the case of the foregoing structure, the insulating layer is preferably filled with fillers corresponding to a plurality of average particle diameters different to each another. According to the structure, when, for example, a predetermined filler and a filler corresponding to an average particle diameter smaller than an average particle diameter of the predetermined filler are used, the filler corresponding to the smaller particle diameter can be filled into any void too small for the predetermined filler to penetrate into. As a result, a filling factor of the fillers filled into the insulating layer can be increased. Further, when a material capable of increasing a thermal conductivity of the insulating layer is employed for the fillers filled into the insulating layer, a heat releasability of the insulating layer can be improved. In order to increase the filling factor of the fillers filled into the insulating layer, a compounding ratio of the filler corresponding to the larger average particle diameter and the filler corresponding to the smaller average particle diameter is preferably set to 8:2.

In the constitution wherein the insulating layer is filled with the fillers corresponding to the plurality of average particle diameters different to each other, the average particle diameter of the filler filled into the part of the insulating layer on the substrate side is preferably smaller than the average particle diameter of the filler filled into the part of the insulating layer on the opposite side relative to the substrate side. According to the structure, the Young's modulus (rigidity) of the part of the insulating layer on the substrate side can be easily smaller than the Young's modulus (rigidity) of the part of the insulating layer on the opposite side relative to the substrate side.

In the case of the foregoing structure, the fillers filled into the insulating layer are preferably distributed in such a manner that the average particle diameters of the fillers can be smaller from the conductive-layer side toward the substrate side. Accordingly, a Young's modulus (rigidity) of an intermediate part of the insulating layer can have a value between the Young's modulus (rigidity) of the part of the insulating layer on the substrate side and the Young's modulus (rigidity) of the part of the insulating layer on the opposite side relative to the substrate side. Thereby, the intermediate part of the insulating layer serves to reduce a tangential stress generated between the part of the insulating layer on the substrate side and the part of the insulating layer on the opposite side relative to the substrate side. As a result, generation of cracks in the insulating layer can be controlled.

In the structure wherein the insulating layer is constituted from a single layer, openings each having an enough depth to reach a surface of the substrate are preferably formed in regions of the insulating layer corresponding to a lower side of the circuit element, and the conductive layer on the insulating layer is preferably formed so as to contact the surface of the substrate via the openings of the insulating layer. Accordingly, when a large quantity of heat is generated in the circuit element, the generated heat can be released toward the substrate side via the conductive layer in contact with the surface of the substrate. Thereby, a heat releasability of the circuit element can be improved.

In the circuit device according to the aspect, the insulating layer includes a first insulating layer having a first Young's modulus and formed on the substrate and a second insulating layer having a second Young's modulus and formed on a surface opposite to the substrate on which the first insulating layer is formed, wherein the first Young's modulus of the first insulating layer is smaller than the second Young's modulus of the second insulating layer. Accordingly, the tangential stress generated between the substrate and the insulating layer (first insulating layer) can be easily reduced by the first insulating layer having the smaller first Young's modulus (rigidity), and further, the substrate under the insulating layer (first insulating layer) can be prevented from warping by the second insulating layer having the larger second Young's modulus (rigidity). Because the insulating layer thus includes the first insulating layer having the smaller first Young's modulus and formed on the substrate and the second insulating layer having the larger second Young's modulus and formed on the surface opposite to the substrate on which the first insulating layer is formed, the Young's modulus (rigidity) of the part of the insulating layer on the substrate side (first insulating layer) can be easily smaller than the Young's modulus (rigidity) of the part of the insulating layer on the opposite side relative to the substrate side.

In the case of the foregoing structure, the first insulating layer is preferably filled with fillers corresponding to a plurality of average particle diameters different to each other, and the second insulating layer is preferably filled with fillers corresponding to a plurality of average particle diameters different to each other. According to the foregoing structure, when, for example, a predetermined filler and a filler corresponding to an average particle diameter smaller than an average particle diameter of the predetermined filler are used, the filler corresponding to the smaller particle diameter can be filled into any void too small for the predetermined filler to penetrate into. As a result, a filling factor of the fillers filled into the first insulating layer (second insulating layer) can be increased. Further, when a material capable of increasing a thermal conductivity of the first insulating layer (second insulating layer) is used as the fillers filled into the first insulating layer (second insulating layer), a heat releasability of the first insulating layer can be improved.

In the structure wherein the first insulating layer (second insulating layer) is filled with the fillers corresponding to the plurality of average particle diameters different to each other, of the fillers filled into the insulating layer, a filler corresponding to a largest average particle diameter is not filled into the first insulating layer but filled into the second insulating layer. Accordingly, the Young's modulus (rigidity) of the first insulating layer can be easily smaller than the Young's modulus (rigidity) of the second insulating layer.

In the case of the foregoing structure, the fillers filled into the second insulating layer preferably includes at least a first filler corresponding to a first average particle diameter, a second filler corresponding to a second average particle diameter smaller than the first average particle diameter, and a third filler corresponding to a third average particle diameter having a dimension between the first average particle diameter and the second average particle diameter. According to the foregoing structure, when there is a large difference between the first average particle diameter of the first filler and the second average particle diameter of the second filler, the third filler having the dimension between the first average particle diameter and the second average particle diameter is further added. Thereby, the filling factor of the fillers in the second insulating layer can be prevented from decreasing.

In the structure wherein the first insulating layer (second insulating layer) is filled with the fillers corresponding to the plurality of average particle diameters different to each other, of the fillers filled into the insulating layer, a filler corresponding to a smallest average particle diameter is preferably filled into both of the first insulating layer and the second insulating layer. According to the foregoing structure, a filling factor of the fillers filled into both of the first insulating layer and the second insulating layer can be easily increased.

In the structure wherein the insulating layer includes the first insulating layer and the second insulating layer, the conductive layer preferably includes a first conductive layer formed between the first insulating layer and the second insulating layer and a second conductive layer formed on the second insulating layer. Further, first openings each having an enough depth to reach the surface of the substrate are formed in regions of the first insulating layer corresponding to the lower side of the circuit element, second openings each having an enough depth to reach a surface of the first conductive layer are formed in regions of the second insulating layer corresponding to the lower side of the circuit element, the first conductive layer includes a first heat releasing part formed so as to contact the surface of the substrate via the first openings of the first insulating layer, and the second conductive layer includes a second heat releasing part formed so as to contact the surface of the first conductive layer via the second openings of the second insulating layer. Accordingly, when a large quantity of heat is generated in the circuit element in the case where the insulating layer has the two-layer structure, the generated heat can be transmitted from the second heat releasing part of the second conductive layer to the first heat releasing part of the first conductive layer in contact with the surface of the substrate. Thereby, the heat can be easily released toward the substrate side. As a result, the heat releasability of the circuit element can be improved in the case of the insulating layer having the two-layer structure.

In the structure wherein the conductive layer includes the first conductive layer and the second conductive layer, the first conductive layer preferably includes a first wiring part in addition to the first heat releasing part, and the second conductive layer preferably includes a second wiring part in addition to the second heat releasing part. Accordingly, the first wiring part of the first conductive layer and the second wiring part of the second conducive layer can be insulated from each other by the second insulating layer. Thereby, even when the first wiring part of the first conductive layer and the second wiring part of the second conductive layer intersect with each other in a planar view, the first wiring part of the first conductive layer and the second wiring part of the second conductive layer can be prevented from electrically short-circuiting relative to each other. As a result, a degree of freedom in a routing process can be improved, and a wiring density can be improved.

In the structure wherein the insulating layer includes the first insulating layer and the second insulating layer, the first insulating layer and the second insulating layer preferably contain a same material as their principle components. Accordingly, the respective average particle diameters of the fillers filled into the first insulating layer and the second insulating layer are controlled so that the first Young's modulus of the first insulating layer can be easily smaller than the second Young's modulus of the second insulating layer.

In the circuit device according to the aspect, the insulating layer preferably includes an insulating layer containing resin as its principle component. According to the foregoing structure, in the circuit device in which the insulating layer containing resin as its principle component is formed on the substrate, the insulating layer can be easily prevented from peeling from the substrate, and the deformation of the circuit device (warping of the substrate) can be controlled.

In the case of the foregoing structure, the filler is preferably formed from a material capable of increasing a thermal conductivity of the insulating layer. Accordingly, the thermal conductivity of the insulating layer containing resin as its principle component is increased, and a heat releasability of the insulating layer containing resin as its principle component can be thereby improved.

In the circuit device according to the aspect, the substrate preferably includes a substrate whose principle component is metal. Accordingly, the substrate whose principle component is metal can efficiently release the heat generated in the circuit element.

In the circuit device according to the aspect, the substrate preferably includes a surface having a corrugated shape. Accordingly, an area where the substrate and the insulating layer are in contact with each other can be increased, and the substrate and the insulating layer can be more closely adhered to each other. As a result, the insulating layer can be prevented from peeling from the substrate.

In the circuit device according to the aspect, the substrate preferably includes a first layer having a first thermal expansion coefficient, a second layer formed on the first layer and having a second thermal expansion coefficient different to the first thermal expansion coefficient of the first layer, and a third layer formed on the second layer and having a third thermal expansion coefficient different to the second thermal expansion coefficient of the second layer. When the substrate is constituted in the foregoing manner, a thermal expansion coefficient of the substrate including the first layer, the second layer and the third layer can be controlled by adjusting a thickness of the first layer, a thickness of the second layer and a thickness of the third layer. Further, when the thickness of the first layer, the thickness of the second layer and the thickness of the third layer are adjusted so that the thermal expansion coefficient of the substrate can approach the thermal expansion coefficients of the circuit element and the insulating layer, the peeling of the insulating layer from the substrate can be controlled as a result of differences generated among the thermal expansion coefficients of the substrate, the circuit element and the insulating layer.

In the circuit device according to the aspect, the surface of the substrate is preferably oxidized or nitrided. Accordingly, the oxidized or nitrided surface of the substrate can function as the insulating layer even if an insulating property of the insulating layer between the substrate and the conductive layer is deteriorated. As a result, a dielectric strength between the substrate and the conductive layer can be prevented from deteriorating.

DETAILED DESCRIPTION OF PREFERRED EMBODIMENTS

Embodiments of the present invention is now described with reference to the drawings.

First Embodiment

First the structure of a hybrid integrated circuit device according to a first embodiment is described with reference to FIGS. 1 and 2.

Figure 2:
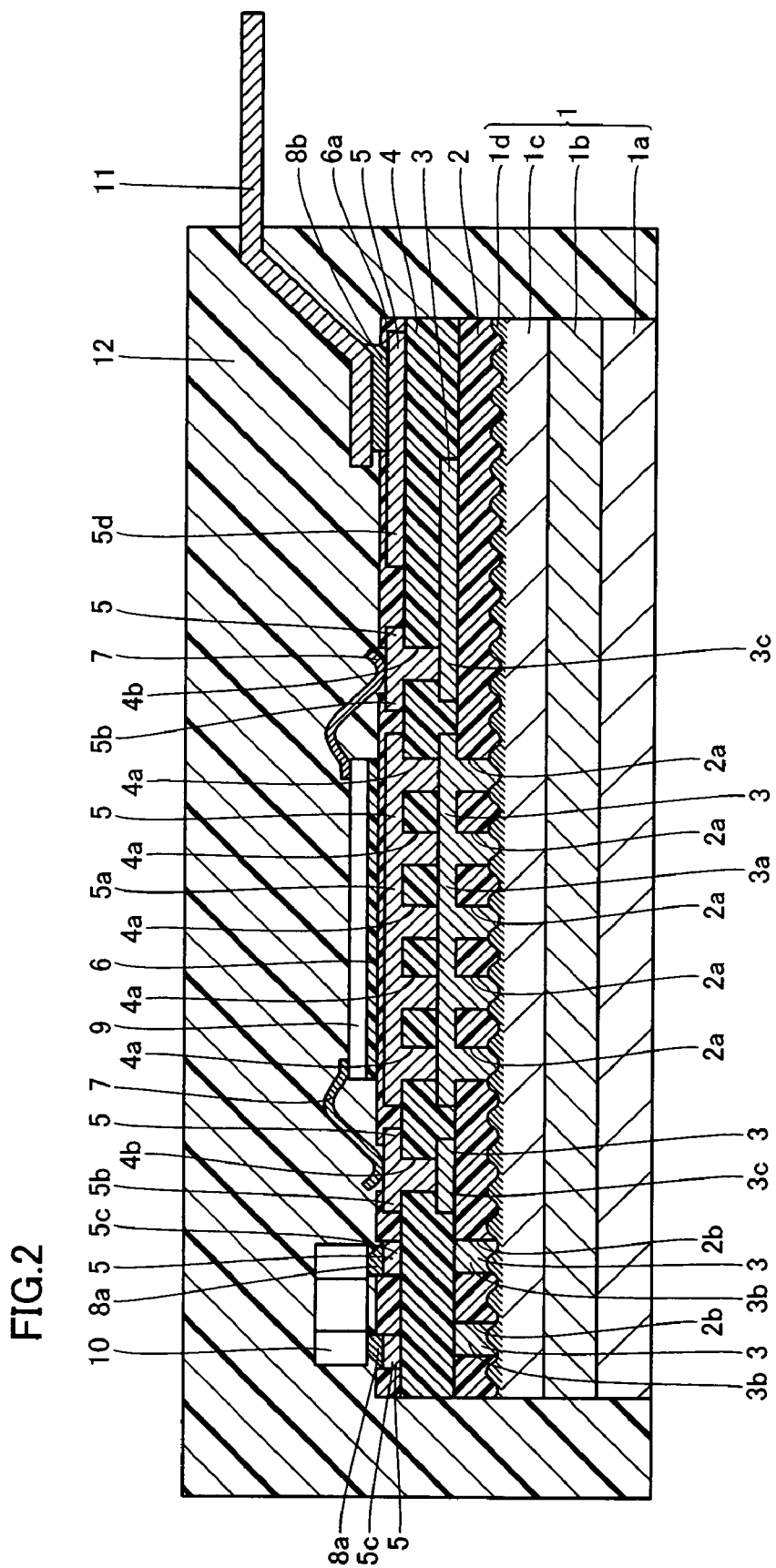
FIG. 2 is a sectional view taken along the line 100-100 in FIG. 1.

In the hybrid integrated circuit device according to the first embodiment, a substrate 1 of a multilayer structure (three-layer structure) having a thickness of about 100 μm to about 3 mm (about 1.5 mm, for example) is employed as shown in FIG. 2. This substrate 1 is constituted of a cladding material prepared by stacking a lower metal layer 1a of copper, an intermediate metal layer 1b of an Fe—Ni alloy (the so-called invar alloy) formed on the lower metal layer 1a and an upper metal layer 1c of copper formed on the intermediate metal layer 1b. The lower and upper metal layers 1a and 1c of copper have thermal expansion coefficients of about 12 ppm/° C. The intermediate metal layer 1b of the invar alloy consists of the alloy of Fe containing about 36% of Ni and has a small thermal expansion coefficient of about 0.2 ppm/° C. to about 5 ppm/° C. In other words, the thermal expansion coefficient (about 0.2 ppm/° C. to about 5 ppm/° C.) of the intermediate metal layer 1b is smaller than the thermal expansion coefficients (about 12 ppm/° C.) of the lower and upper metal layers 1a and 1c. The thicknesses of the lower, intermediate and upper metal layers 1a, 1b and 1c are adjusted in the ratios 1:1:1, so that the thermal expansion coefficient of the substrate 1 is about 6 ppm/° C. to about 8 ppm/° C. The lower, intermediate and upper metal layers 1a, 1b and 1c are examples of the "first layer", the "second layer" and the "third layer" in the present invention respectively.

According to the first embodiment a copper oxide film 1d having a thickness of about 0.1 μm to about 0.3 μm is formed on the surface of the upper metal layer 1c, i.e., the uppermost one of the three metal layers 1a to 1c constituting the substrate 1. This copper oxide film 1d is formed by oxidizing the surface of the upper metal layer 1c. According to the first embodiment the surface of the substrate 1 (copper oxide film 1d) is formed in a corrugated shape having arithmetic mean roughness (Ra) of about 10 μm to about 20 μm.

A first resin layer 2, mainly composed of epoxy resin, having a thickness of about 60 μm to about 160 μm is formed on the corrugated surface of the substrate 1 (copper oxide film 1d). The first resin layer 2 functions as an insulating layer. The thermal expansion coefficient of the first resin layer 2 is about 17 ppm/° C. to about 18 ppm/° C. The first resin layer 2 is an example of the "insulating layer" in the present invention.

Figure 3:
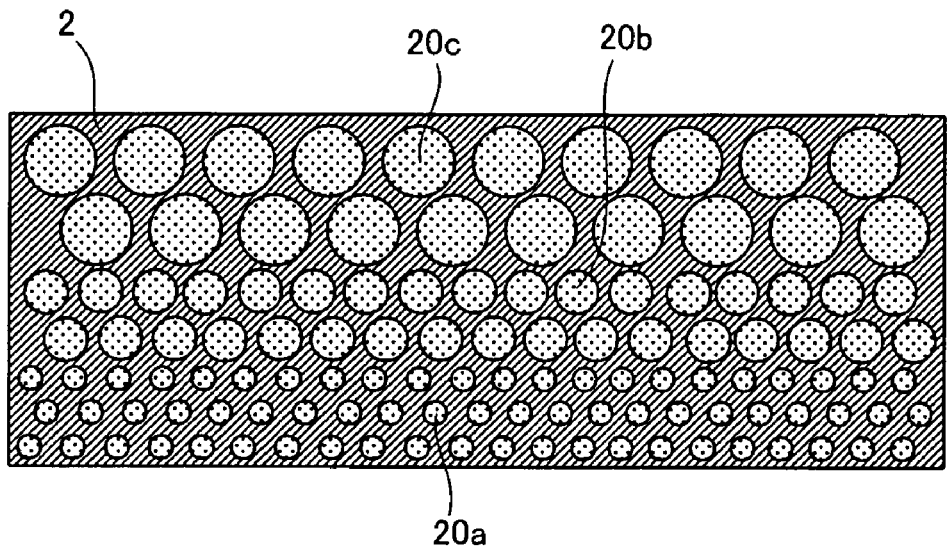
FIG. 3 is a schematic illustration of distribution of fillers filled into a resin layer of the hybrid integrated circuit device according to the first embodiment shown in FIG. 2.

According to the first embodiment, as shown in FIG. 3, fillers 20a, 20b and 20c corresponding to three kinds of average particle diameter different to each other are added to the first resin layer 2, in order to increase the thermal conductivity of the first resin layer 2 mainly composed of epoxy resin. This filler is prepared from alumina ($Al_2O_3$), silica ($SiO_2$), aluminum nitride (AlN), silicon nitride (SiN) or boron nitride (BN). When the filler such as alumina or sillca is added at a weight filling factor of approximately 85%, the epoxy resin exhibits thermal conductivity of about 3 W/(m·K), which is higher than the thermal conductivity (about 0.6 W/(m·K)) of epoxy resin containing no filler.

Average particle diameters of the fillers 20a, 20b and 20c filled into the resin layer 2 are respectively set to approximately 1 μm, approximately 10 μm and approximately 20 μm. For example, the filler 20b having the average particle diameter of approximately 10 μm refers to a filler whose average particle diameter is approximately 10 μm and range of an inaccuracy is approximately ±10%. In the resin layer 2, a layer including only the filler 20a (average particle diameter: approximately 1 μm), a layer including only the filler 20b (average particle diameter: approximately 10 μm) and a layer including only the filler 20c (average particle diameter: approximately 20 μm) are provided in the stated order from the substrate 1 side (see FIG. 2). A total weight filling factor of the fillers 20a, 20b, and 20c filled into the resin layer 2 is approximately 60% to approximately 90%.

In the first embodiment, a rigidity (Young's modulus) of a part of the insulating layer 2 on the substrate 1 side (see FIG. 2) is lower than a rigidity (Young's modulus) of a part of the insulating layer 2 on an opposite side relative to the substrate 1 side because the resin layer 2 has the described structure. More specifically, in the resin layer 2, a Young's modulus of the layer including the filler 20a (average particle diameter: approximately 1 μm), a Young's modulus of the layer including the filler 20b (average particle diameter: approximately 10 μm), and a Young's modulus of the layer including the filler 20c (average particle diameter: approximately 20 μm) are respectively, approximately $0.5 \times 10^{10}$ Pa, approximately $0.7 \times 10^{10}$ Pa, and approximately $10 \times 10^{10}$ Pa.

According to the first embodiment, as shown in FIG. 2, five via holes 2a of about 70 μm in diameter passing through the first resin layer 2 are formed in a prescribed region of the first resin layer 2 located under an LSI chip 9 described later. Two via holes 2b of about 70 μm in diameter passing through the first resin layer 2 are formed in another prescribed region of the first resin layer 2 located under a chip resistor 10 described later. The via holes 2a and 2b are examples of the "opening" in the present invention. A first conductive layer 3 of copper having a thickness of about 15 μm and including thermal via portions 3a and 3b and wiring portions 3c is formed on still another prescribed region of the first resin layer 2. The thermal via portion 3a is arranged in the region located under the LSI chip 9, and has portions embedded in the via holes 2a, to be in contact with the surface of the substrate 1. The thermal via portions 3b are embedded in the via holes 2b located in the region under the chip resistor 10. The thermal via portions 3a and 3b of the first conductive layer 3 have functions of releasing heat toward the substrate 1. The first resin layer 2 partially receiving the first conductive layer 3 in the via holes 2a and 2b exhibits thermal conductivity of about 6 W/(m·K) to about 8 W/(m·K). The wiring portions 3c of the first conductive layer 3 are arranged on regions separated from ends of the thermal via portion 3a at prescribed intervals.

According to the first embodiment, a second resin layer 4 identical in thickness and composition to the aforementioned first resin layer 2 is formed to cover the first conductive layer 3, while a second conductive layer 5 of copper having the same thickness as the aforementioned first conductive layer 3 is formed on a prescribed region of the second resin layer 4. The second resin layer 4 and the second conductive layer 5 have structures for transferring heat to the thermal via portion 3a of the first conductive layer 3. The second resin layer 4 is an example of the "insulating layer" in the present invention.

More specifically, five via holes 4a of about 70 μm in diameter passing through the second resin layer 4 are formed in a region of the second resin layer 4 located under the LSI chip 9. The five via holes 4a are formed in positions corresponding to the five via holes 2a respectively. Two via holes 4b of about 70 μm in diameter passing through the second resin layer 4 are formed in a region of the second resin layer 4 corresponding to the wiring portions 3c of the first conductive layer 3. The second conductive layer 5 includes a thermal via portion 5a, wire bonding portions 5b and wiring portions 5c and 5d. The wiring portion 5d is an example of the "second wire" in the present invention. The thermal via portion 5a of the second conductive layer 5 is arranged on the region located under the LSI chip 9 and has portions embedded in the via holes 4a to be in contact with the surface of the thermal via portion 3a of the first conductive layer 3. The thermal via portion 5a of the second conductive layer 5 has a function of transferring heat generated in the LSI chip 9 and the chip resistor 10 to the thermal via portion 3a of the first conductive layer 3 thereby releasing the same. The wire bonding portions 5b of the second conductive layer 5 are arranged on regions corresponding to the via holes 4b, and have portions embedded in the via holes 4b, to be in contact with the surfaces of the wiring portions 3c of the first conductive layer 3. The wiring portion 5c of the second conductive layer 5 is arranged on the region located under the chip resistor 10. The wiring portion 5d of the second conductive layer 5 is arranged on a region located under a lead 11 described later. The wiring portion 5d of the second conductive layer 5 is arranged to intersect with the wiring portions 3c of the first conductive layer 3, although this intersection is not illustrated.

A solder resist layer 6a having openings in regions corresponding to the wire bonding portions 5b and the wiring portions 5c and 5d of the second conductive layer 5 is formed to cover the second conductive layer 5. This solder resist layer 6a functions as a protective film for the second conductive layer 5. The solder resist layer 6a consists of thermosetting resin such as a melamine derivative, a liquid crystal polymer, epoxy resin, PPE (polyphenylene ether) resin, polyimide resin, fluororesin, phenol resin or polyamide bismaleimide. The liquid crystal polymer, epoxy resin or melamine derivative having an excellent high-frequency characteristic is preferable as the material for the solder resist layer 6a. A filler such as $SiO_2$ may be added to the solder resist layer 6a. The LSI chip 9 is mounted on the solder resist layer 6a located on the thermal via portion 5a of the second conductive layer 5 through a third resin layer 6 of epoxy resin having a thickness of about 20 μm. The LSI chip 9 employing a single-crystalline silicon substrate (not shown) has a thermal expansion coefficient of about 4 ppm/° C. This LSI chip 9 is electrically connected to the wire bonding portions 5b of the second conductive layer 5 through wires 7. The chip resistor 10 is mounted on the wiring portion 5c of the second conductive layer 5 through a fusion layer 8a of brazing filler metal such solder, and electrically connected to the wiring portion 5c through the fusion layer 8a. The LSI chip 9 and the chip resistor 10 are examples of the "circuit element" in the present invention. The lead 11 is mounted on the wiring portion 5d of the second conductive layer 5 through another fusion layer 8b of brazing filler metal such as solder and electrically connected to the wiring portion 5d through the fusion layer 8b.

Figure 1:
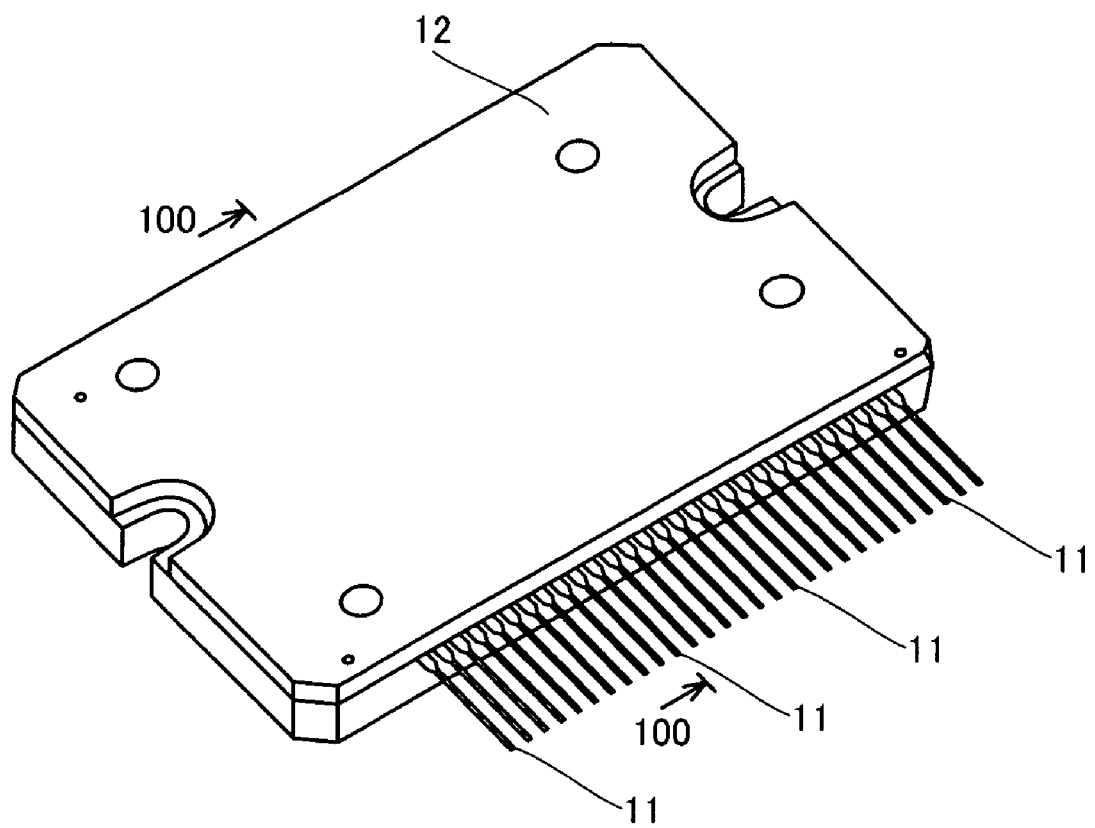
FIG. 1 is a perspective view showing a structure of a hybrid integrated circuit device (hybrid IC) according to a first embodiment of the present invention.

As shown in FIGS. 1 and 2, a fourth resin layer 12 of epoxy resin is formed to cover the LSI chip 9 and the chip resistor 10, in order to protect the LSI chip 9 and the chip resistor 10 mounted in the hybrid integrated circuit device. A plurality of leads 11 are provided on one side of the hybrid integrated circuit device, as shown in FIG. 1.

In the first embodiment, as described above, the average particle diameters of the fillers 20a, 20b and 20c filled into the resin layer 2 whose principle component is epoxy resin are respectively set to approximately 1 μm, approximately 10 μm, and approximately 20 μm, and the layer including the filler 20a (average particle diameter: approximately 1 μm), the layer including the filler 20b (average particle diameter: approximately 10 μm) and the layer including the filler 20c (average particle diameter: approximately 20 μm) are provided in the resin layer 2 in the stated order from the substrate 1 side. Then, the Young' modulus (rigidity) of the part of the resin layer 2 on the substrate 1 side can be smaller than the Young's modulus (rigidity) of the part of the resin layer 2 on the opposite side relative to the substrate 1 side. Thereby, even if the resin layer 2 formed on the substrate 1 is pulled by the substrate 1 when the substrate 1 expands due to the heat generated in the LSI chip 9 and the chip resistor 10, a tangential stress generated between the substrate 1 and the resin layer 2 can be reduced since the part of the resin layer 2 on the substrate 1 side having the smaller Young's modulus (rigidity) is deformed in such a manner as stretching together with the substrate 1. As a result, the resin layer 2 can be prevented from peeling from the substrate 1. Further, even when the substrate 1 expands due to the heat generated in the LSI chip 9 and the chip resistor 10, the substrate 1 under the resin layer 2 can be prevented from warping because of the larger Young's modulus (rigidity) of the part of the resin layer 2 on the opposite side relative to the substrate 1 side. Thereby, the deformation of the hybrid integrated circuit device can be controlled.

Further, in the first embodiment, the layer including the filler 20a (average particle diameter: approximately 1 μm), the layer including the filler 20b (average particle diameter: approximately 10 μm) and the layer including the filler 20c (average particle diameter: approximately 20 μm) are provided in the stated order from the substrate 1 side in the first resin layer 2 as described above, so that the Young's modulus (rigidity) of the intermediate part of the resin layer 2 can have a value between the Young's modulus (rigidity) of the part of the resin layer 2 on the substrate 1 side and the Young's modulus (rigidity) of the part of the resin layer 2 on the opposite side relative to the substrate 1 side. As a result, a tangential stress generated between the part of the resin layer 2 on the substrate 1 side and the part of the resin layer 2 on the opposite side relative to the substrate 1 side can be reduced by the intermediate part of the resin layer 2, and generation of cracks in the first resin layer 2 can be controlled. The second resin layer 4, which has the same structure as that of the first resin layer 2, can also effectively control the generation of cracks therein.

Further, in the first embodiment, the fillers 20a-20c are formed from the material capable of increasing the thermal conductivity of the first resin layer 2 as described so that the thermal conductivity of the resin layer 2 whose principle component is epoxy resin is increased. As a result, the heat releasability of the resin layer 2 whose principle component is epoxy resin can be improved. The second resin layer 4, which has the same structure as that of the first resin layer 2, can also effectively improve the heat releasability.

In the first embodiment, as described, the conductive layer 3 is adapted to include the thermal via part 3a in contact with the surface of the substrate 1 via the via holes 2a of the resin layer 2, and the conductive layer 5 is adapted to include the thermal via part 5a in contact with the surface of the conductive layer 3 via the via holes 4a of the resin layer 4. According to the structure, when a large quantity of heat is generated in the LSI chip 9, the generated heat can be transmitted from the thermal via part 5a of the conductive layer 5 to the thermal via part 3a of the conductive layer 3 in contact with the surface of the substrate 1. Further, the conductive layer 3 is adapted to include the thermal via parts 3b in contact with the surface of the substrate 1 via the via holes 2b of the resin layer 2. According to the structure, when a large quantity of heat is generated in the chip resistor 10, the generated heat can be transmitted to the thermal via parts 3b of the conductive layer 3 in contact with the surface of the substrate 1. Accordingly, when the plenty of is generated in the LSI chip 9 and the chip resistor 10, the generated heat can be easily released to the substrate 1 side.

In the first embodiment, the first resin layer 2 and the conductive layer 3 are serially formed, and the second resin layer 4 and the conductive layer 5 are serially formed on the first conductive layer 3 as described above. According to the structure, the wiring parts 3c of the conductive layer 3 and the wiring part 5d of the conductive layer 5 can be insulated from each other by the resin layer 4. Thereby, even though the wiring parts 3c of the conductive layer 3 and the wiring part 5d of the conductive layer 5 intersect with each other in the planar view, the wiring parts 3c of the conductive layer 3 and the wiring part 5d of the conductive layer 5 can be prevented from electrically short-circuiting relative to each other. As a result, a degree of freedom in a routing process of the wiring parts 3c and 5d can be improved, and a wiring density can also be improved.

In the first embodiment, as described, the substrate 1 whose principle component is metal is used, which allows the heat generated in the LSI chip 9 and the chip resistor 10 to be efficiently released.

According to the first embodiment, as hereinabove described, the substrate 1 is formed to have the corrugated surface while the first resin layer 2 mainly composed of epoxy resin for serving as an insulating layer is formed on the corrugated surface of the substrate 1, whereby the contact area between the substrate 1 and the first resin layer 2 can be increased. Thus, adhesiveness between the substrate 1 and the first resin layer 2 can be improved. Consequently, the first resin layer 2 serving as an insulating layer can be inhibited from separating from the substrate 1.

According to the first embodiment, further, the substrate 1 including the lower and upper metal layers 1a and 1c of copper having the thermal expansion coefficients of about 12 ppm/° C. and the intermediate metal layer 1b of the invar alloy having the thermal expansion coefficient of about 0.2 ppm/° C. to about 5 ppm/° C. is employed while the thicknesses of the lower, intermediate and upper metal layers 1a, 1b and 1c are adjusted in the ratios 1:1:1 so that the thermal expansion coefficient of the substrate 1 is about 6 ppm/° C. to about 8 ppm/° C., whereby the thermal expansion coefficient (about 6 ppm/° C. to about 8 ppm/° C.) of the substrate 1 can be approached to both of the thermal expansion coefficient (about 4 ppm/° C.) of the LSI chip 9 and the thermal expansion coefficient (about 17 ppm/° C. to about 18 ppm/° C.) of the first resin layer 2. Thus the first resin layer 2 can be inhibited from separating from the substrate 1 due to difference in thermal expansion coefficient between the substrate 1 and the LSI chip 9 and the first resin layer 2.

According to the first embodiment, in addition the surface of the substrate 1 (upper metal layer 1c) is oxidized to form the copper oxide film 1d on the surface of the substrate 1 (upper metal layer 1c) so that the copper oxide film 1d on the surface of the substrate 1 functions as another insulating layer when the first resin layer 2 located between the substrate 1 and the wiring portions 3c of the first conductive layer 3 is deteriorated in insulating property, whereby the dielectric voltage between the substrate 1 and the wiring portions 3c of the first conductive layer 3 can be inhibited from reduction.

A process of fabricating the hybrid integrated circuit device according to the first embodiment is now described with reference to FIGS. 2 to 16.

Figure 4:
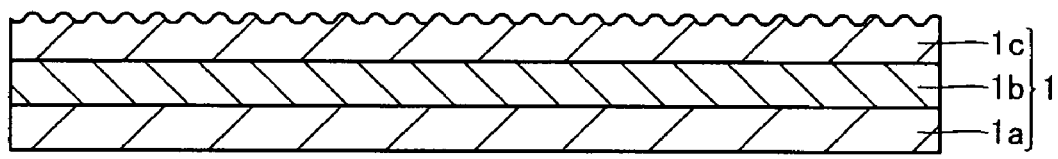
FIGS. 4-16 are sectional views for illustrating a process of fabricating the hybrid integrated circuit device according to the first embodiment shown in FIG. 2.

First, the substrate 1 including the lower and upper metal layers 1a and 1c of copper having the thermal expansion coefficients of about 12 ppm/° C. and the intermediate metal layer 1b of the invar alloy having the thermal expansion coefficient of about 0.2 ppm/° C. to about 5 ppm/° C. is formed as shown in FIG. 4. More specifically, the intermediate metal layer 1b is arranged and pressed between the lower and upper metal layers 1a and 1c, thereby forming the substrate 1 of the cladding material having the three-layer structure. At this time the thicknesses of the lower, intermediate and upper metal layers 1a, 1b and 1c are so set that the thickness of the substrate 1 is about 100 µm to about 3 mm (about 1.5 mm, for example) respectively. According to the first embodiment, the thicknesses of the lower. intermediate and upper metal layers 1a, 1b and 1c are adjusted in the ratios 1:1:1. Thus, the substrate 1 has the thermal expansion coefficient of about 6 ppm/° C. to about 8 ppm/° C.

Figure 5:
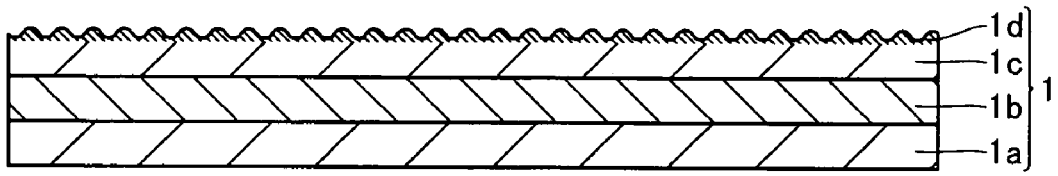

Thereafter the surface of the upper metal layer 1c forming the uppermost layer constituting the substrate 1 is roughened into the corrugated shape having the arithmetic mean roughness Ra of about 10 µm to about 20 µm by sandblasting, wet blasting or wet etching. The sandblasting is a technique of spraying abrasive to a work by accelerating the abrasive with compressed air from a compressor. The wet blasting is a technique of spraying abrasive to a work by accelerating a liquid mixed with the abrasive with compressed air from a compressor, As shown in FIG. 5, the corrugated surface of the upper metal layer 1c forming the uppermost layer constituting the substrate 1 is oxidized by heat-treating the substrate 1 under a temperature condition of one hundred and several 10 degrees. Thus, the corrugated surface of the upper metal layer 1c forming the uppermost layer of the substrate 1 is converted to the copper oxide film 1d having the thickness of about 0.1 µm to about 0.3 µm.

Figure 6:
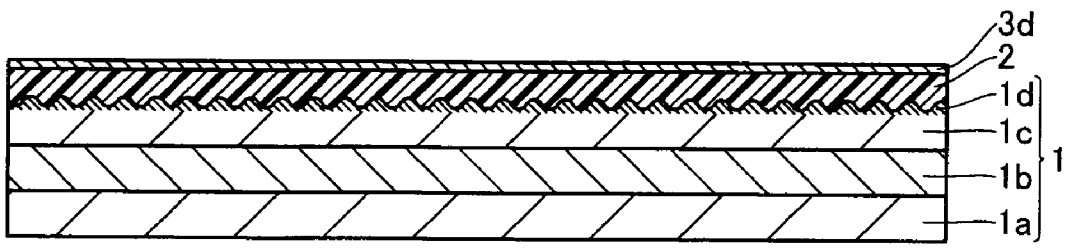

As shown in FIG. 6, epoxy resin including the filler 20a (average particle diameter: approximately 1 µm), the filler 20b (average particle diameter: approximately 10 µm), and the filler 20c (average particle diameter: approximately 20 µm), which respectively correspond to the three average particle diameters different to one another (see FIG. 3) is applied to the corrugated surface of the substrate 1 (copper oxide film 1d), thereby forming the first resin layer 2 having the thickness of about 60 µm to about 160 µm. In the application, as shown in FIG. 3, the layer including the filler 20a (average particle diameter: approximately 1 µm), the layer including the filler 20b (average particle diameter: approximately 10 µm), and the layer including the filler 20c (average particle diameter: approximately 20 µm) are provided in the resin layer 2 in the stated order from the substrate 1 side. Thereafter a copper foil film 3d having a thickness of about 3 µm is pressure-bonded onto the first resin layer 2.

Figure 7:
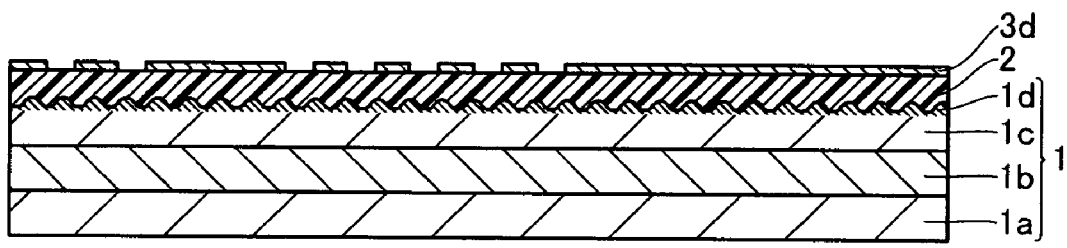

As shown in FIG. 7, portions of the copper foil film 3d located on regions for forming the via holes 2a and 2b (see FIG. 2) are removed by photolithography and etching. Thus, the regions of the first resin layer 2 for forming the via holes 2a and 2b are exposed.

Figure 8:
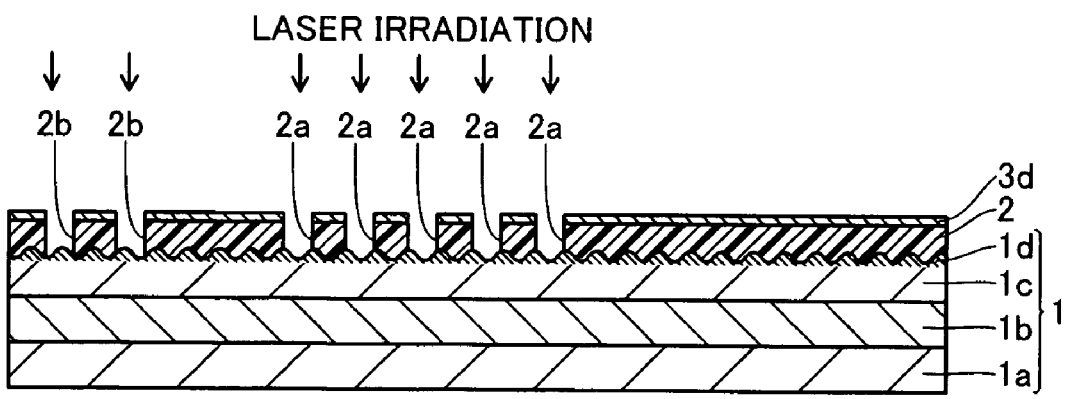

As shown in FIG. 8, a carbon dioxide laser beam or a UV laser beam is applied from above the copper foil film 3d, thereby removing the regions reaching the surface of the substrate 1 from the exposed surface portions of the first resin layer 2 Thus, the five via holes 2a and the two via holes 2b of about 70 µm in diameter passing through the first resin layer 2 are formed in the first resin layer 2. The via holes 2a and 2b are provided for forming the thermal via portions 3a and 3b described later respectively.

Figure 9:
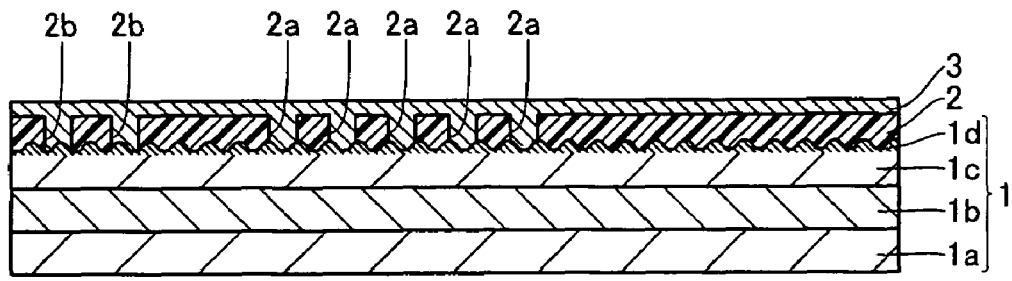

As shown in FIG. 9, the upper surface of the copper foil film 3d (see FIG. 8) and the inner surfaces of the via holes 2a and 2b are plated with copper by electroless plating, with a thickness of about 0.5 µm. Then, the upper surface of the copper foil film 3d and the inner surfaces of the via holes 2a and 2b are plated by electrolytic plating. According to the first embodiment, an inhibitor and a promoter are added to a plating solution so that the upper surface of the copper foil film 3d adsorbs the inhibitor while the inner surfaces of the via holes 2a and 2b adsorb the promoter. Thus, the copper plating films formed on the inner surfaces of the via holes 2a and 2b can be increased in thickness, so that copper can be embedded in the via holes 2a and 2b. Consequently, the first conductive layer 3 having the thickness of about 15 μm is formed on the first resin layer 2 and partially embedded in the via holes 2a and 2b as shown in FIG. 9.

In the aforementioned copper plating step, the plating solution can be inhibited from deterioration resulting from elution of the component of the intermediate metal layer 1b of the invar alloy, due to the substrate 1 obtained by holding the intermediate metal layer 1b of the invar alloy containing Fe and Ni between the lower and upper metal layers 1a and 1b employed according to the first embodiment.

Figure 10:
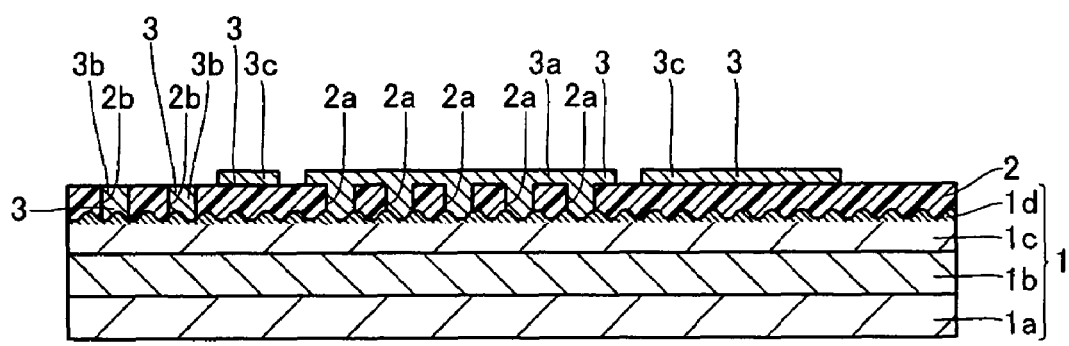

As shown in FIG. 10, the first conductive layer 3 is patterned by photolithography and etching. Thus, the thennal via portions 3a and 3b are formed on the regions located under the LSI chip 9 (see FIG. 2) and the chip resistor 10 (see FIG. 2) respectively while the wiring portions 3c are formed on the regions separated from the ends of the thermal via portion 3a at the prescribed intervals.

Figure 11:
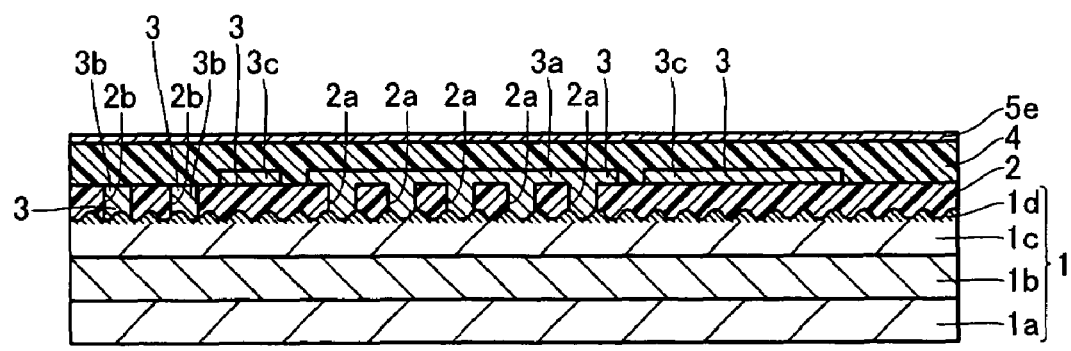

As shown in FIG. 11, epoxy resin including three different fillers which respectively correspond to the three average particle diameters different to one another (see FIG. 3) is applied so as to cover the conductive layer 3, thereby forming the second resin layer 4 having the thickness of about 60 μm to about 160 μm. The three different fillers used for the formation of the resin layer 4 respectively have the same average particle diameters as those of the filler 20a (average particle diameter: approximately 1 μm), the filler 20b (average particle diameter: approximately 10 μm) and the filler 20c (average particle diameter: approximately 20 μm), which are shown in FIG. 3. Further, when the resin layer 4 is formed, the layer including the filler corresponding to the average particle diameter of approximately 1 μm, the layer including the filler corresponding to the average particle diameter of approximately 10 μm, and the layer including the filler corresponding to the average particle diameter of approximately 20 μm are arranged in the stated order from the substrate 1 side. Thereafter another copper foil film 5e having a thickness of about 3 μm is pressure-bonded onto the second resin layer 4.

Figure 12:
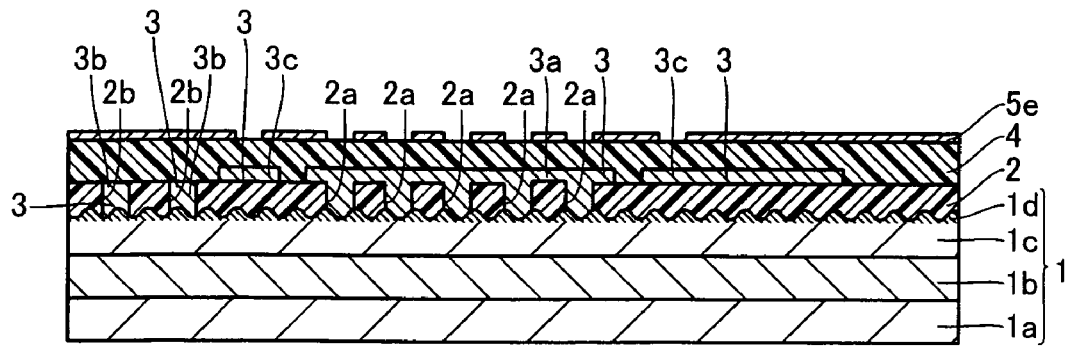

As shown in FIG. 12, portions of the copper foil film 5e located on the regions for forming the via holes 4a and 4b (see FIG. 2) are removed by photolithography and etching. Thus, the regions of the second resin layer 4 for forming the via holes 4a and 4b are exposed.

Figure 13:
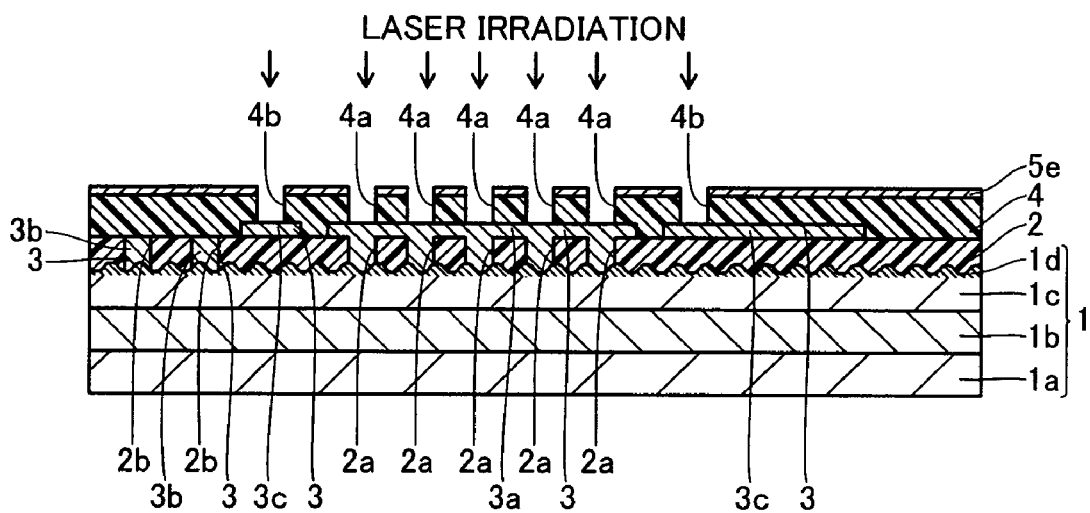

As shown in FIG. 13, a carbon dioxide laser beam or a UV laser beam is applied from above the copper foil film 5e, thereby removing the regions reaching the surface of the first conductive layer 3 from the exposed surface portions of the second resin layer 4. Thus, the five via holes 4a and the two via holes 4b of about 70 μm in diameter passing through the second resin layer 4 are formed in the second resin layer 4.

Figure 14:
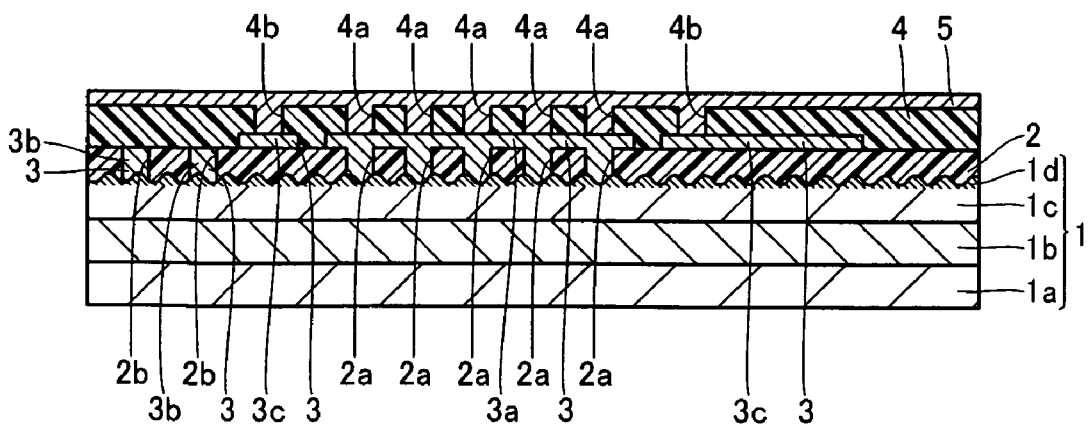

As shown in FIG. 14, the upper surface of the copper foil film 5e (see FIG. 13) and the inner surfaces of the via holes 4a and 4b are plated with copper by electroless plating, with a thickness of about 0.5 μm. Then, the upper surface of the copper foil film 5e and the inner surfaces of the via holes 4a and 4b are plated by electrolytic plating. At this time, an inhibitor and a promoter are added to a plating solution so that the upper surface of the copper foil film 5e adsorbs the inhibitor while the inner surfaces of the via holes 4a and 4b adsorb the promoter. Thus, the copper plating films formed on the inner surfaces of the via holes 4a and 4b can be increased in thickness, so that copper can be embedded in the via holes 4a and 4b. Consequently, the second conductive layer 5 having the thickness of about 15 μm is formed on the second resin layer 4 and partially embedded in the via holes 4a and 4b.

Figure 15:
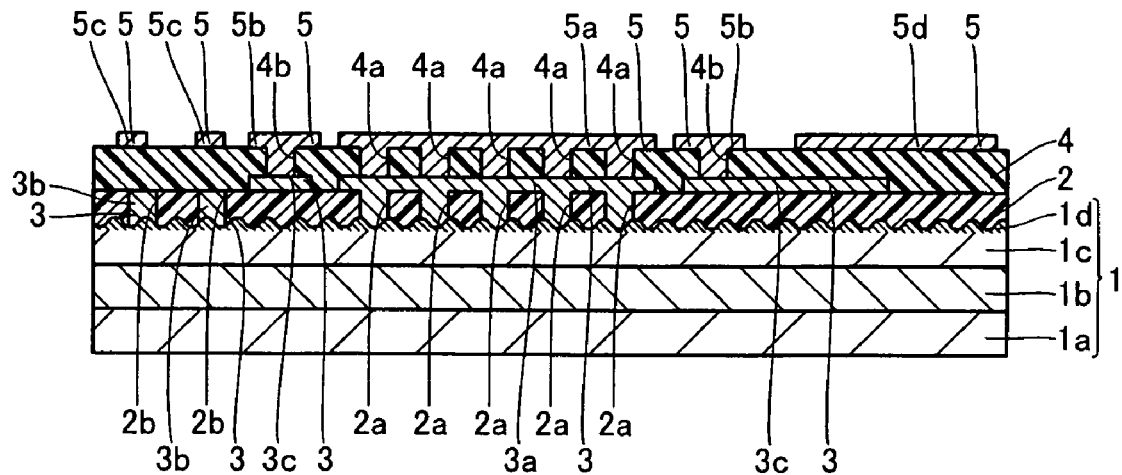

As shown in FIG. 15, the second conductive layer 5 is patterned by photolithography and etching. Thus, the thermal via portion 5a located on the region under the LSI chip 9 (see FIG. 2), the wire bonding portions 5b located on the regions separated from the ends of the thermal via portion 5a at the prescribed intervals and the wiring portions 5c and 5d located on the regions under the chip resistor 10 (see FIG. 2) and the lead 11 (see FIG. 2) respectively are formed.

Figure 16:
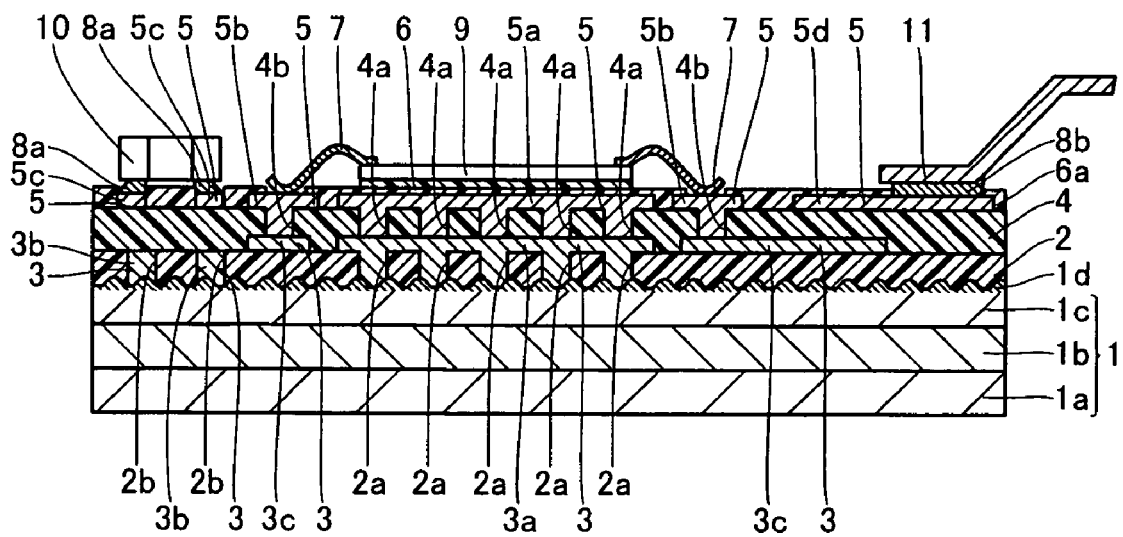

As shown in FIG. 16, the solder resist layer 6a having the openings in the regions corresponding to the wire bonding portions 5b and the wiring portions 5c and 5d of the second conductive layer 5 respectively is formed to cover the second conductive layer 5. The LSI chip 9 is mounted on the portion of the solder resist layer 6a located on the thermal via portion 5a of the second conductive layer 5 through the third resin layer 6 of epoxy resin having the thickness of about 50 μm. After this mounting of the LSI chip 9, the thickness of the third resin layer 6 is about 20 μm. Thereafter the LSI chip 9 and the wire bonding portions 5b of the second conductive layer 5 are electrically connected with each other through the wires 7. Further, the chip resistor 10 is mounted on the wiring portion 5c of the second conductive layer 5 through the fusion layer 8a of the brazing filler metal such as solder. In addition, the lead 11 is mounted on the wiring portion 5d of the second conductive layer 5 through the fusion layer 8b of the brazing filler metal such as solder. The chip resistor 10 and the lead 11 are electrically connected to the wiring portions 5c and 5d through the fusion layers 8a and 8b respectively.

Finally, the fourth resin layer 12 of epoxy resin is formed to cover the LSI chip 9 and the chip resistor 10 in order to protect the LSI chip 9 and the chip resistor 10 provided on the substrate 1, thereby completing the hybrid integrated circuit device according to the first embodiment.

Second Embodiment

In a second embodiment of the present invention, referring to FIGS. 17-21, described is a case where respective average particle diameters of a filler filled into a first resin layer and a filer filled into a second resin layer are controlled so that a Young's modulus of the first resin layer can be smaller than a Young's modulus of the second resin layer, which is different to the first embodiment.

Figure 17:
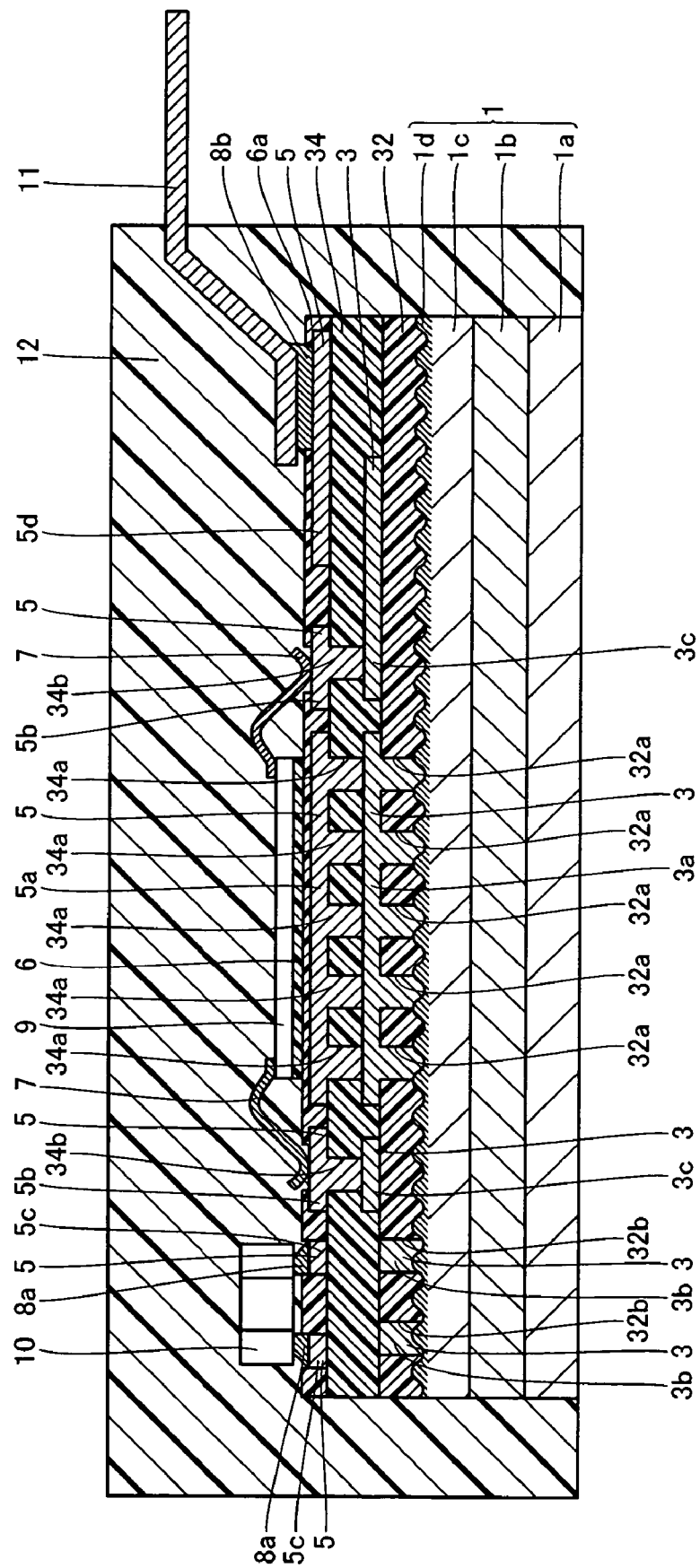
FIG. 17 is a sectional view showing a structure of a hybrid integrated circuit device according to a second embodiment of the present invention.

In the second embodiment, as shown in FIG. 17, a first resin layer 32 whose principle component is epoxy resin having a thickness of approximately 120 μm is formed on a substrate 1 constituted in the same manner as described in the first embodiment. The resin layer 32 functions as an insulating layer. The resin layer 32 is an example of the "insulating layer" and the "first insulating layer" according to the present invention.

Figure 18:
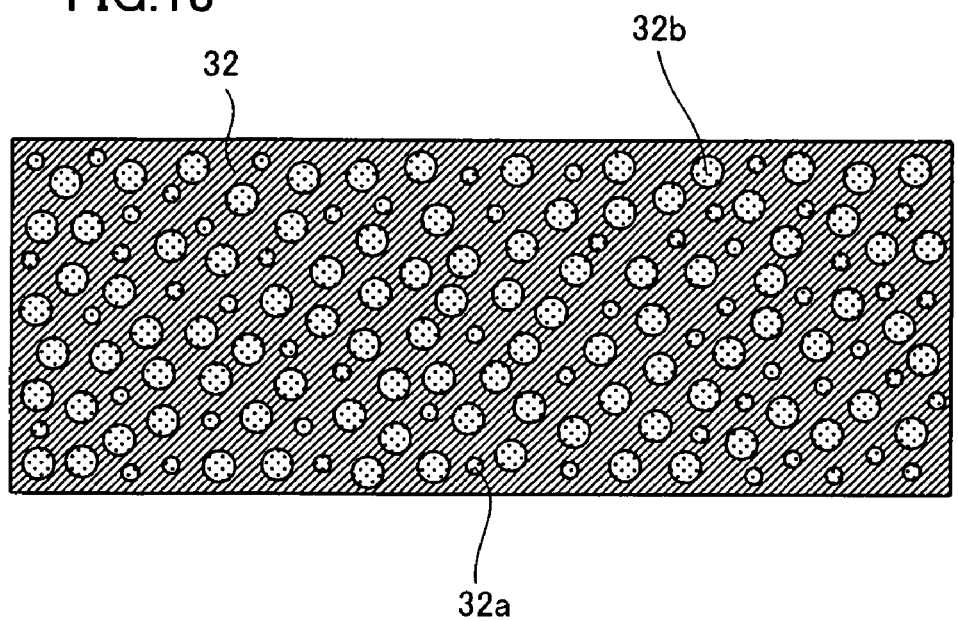
FIG. 18 is a schematic illustration of distribution of fillers filled into a first resin layer of the hybrid integrated circuit device according to the second embodiment shown in FIG. 17.
Figure 19:
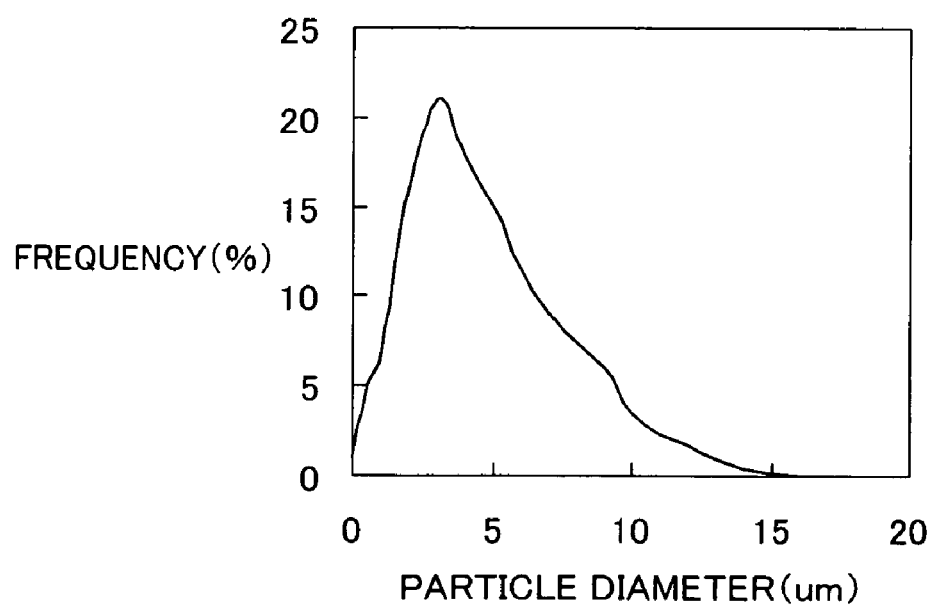
FIG. 19 is a graph showing the distribution of the fillers filled into the first resin layer in the hybrid integrated circuit device according to the second embodiment shown in FIG. 17.

In the second embodiment, as shown in FIG. 18, fillers including at least fillers 32a and 32b corresponding to two average particle diameters different to each other are filled into the resin layer 32 at a weight filling factor of approximately 75%. Average particle diameters of the fillers 32a and 32b are respectively approximately 0.7 μm and approximately 3 μm, and the filler 32a (average particle diameter: approximately 0.7 μm) and the filler 32b (average particle diameter: approximately 3 μm) are filled into the resin layer 32 at frequencies shown in FIG. 19. More specifically, a compounding ratio of the fillers 32a and 32b is 2:8. As a material constituting the fillers 32a and 32b is used alumina ($Al_2O_3$) capable of improving a thermal conductivity of the resin layer 32.

In the second embodiment, as described, the fillers 32a and 32b are used so that a Young's modulus (rigidity) of the first resin layer 32 is set to approximately 38470 MPa. Further, the thermal conductivity and thermal expansion coefficient of the first resin layer 32 are respectively approximately 4.4 W/(m·K) and approximately 10 ppm/° C.

In the second embodiment, as shown in FIG. 17, five via holes 32a each having a diameter of approximately 70 μm and penetrating though the resin layer 32 are formed in predetermined regions of the resin layer 32 located on a lower side of an LSI chip 9. Further, two via holes 32b each having a diameter of approximately 70 μm and penetrating though the resin layer 32 are formed in predetermined regions of the resin layer 32 located on a lower side of a chip resistor 10. The via holes 32a and 32b are examples of the "opening" and the "first opening" according to the present invention.

A first conductive layer 3 formed from copper, having a thickness of approximately 15 μm and including thermal via parts 3a and 3b and wiring parts 3c is formed in predetermined regions on the resin layer 32. The conductive layer 3 is an example of the "first conductive layer" according to the present invention. The thermal via parts 3a and 3b are examples of the "first heat releasing part" according to the present invention. The wiring part 3c is an example of the "first wiring part" according to the present invention. The thermal via part 3a of the conductive layer 3 is provided in a region on the lower side of the LSI chip 9 and has parts embedded in the via holes 32a so as to contact a surface of the substrate 1. The thermal via parts 3b are embedded in the via holes 32b provided in the regions on the lower side of the chip resistor 10. The thermal via parts 3a and 3b of the conductive layer 3 serves to release heat toward the substrate 1.

In the second embodiment, a second resin layer 34 whose principle component is epoxy resin having a thickness of approximately 155 μm is formed so as to cover the conductive layer 3. The resin layer 34 functions as an insulating layer. The resin layer 34 is an example of the "insulating layer" and the "second insulating layer" according to the present invention.

Figure 20:
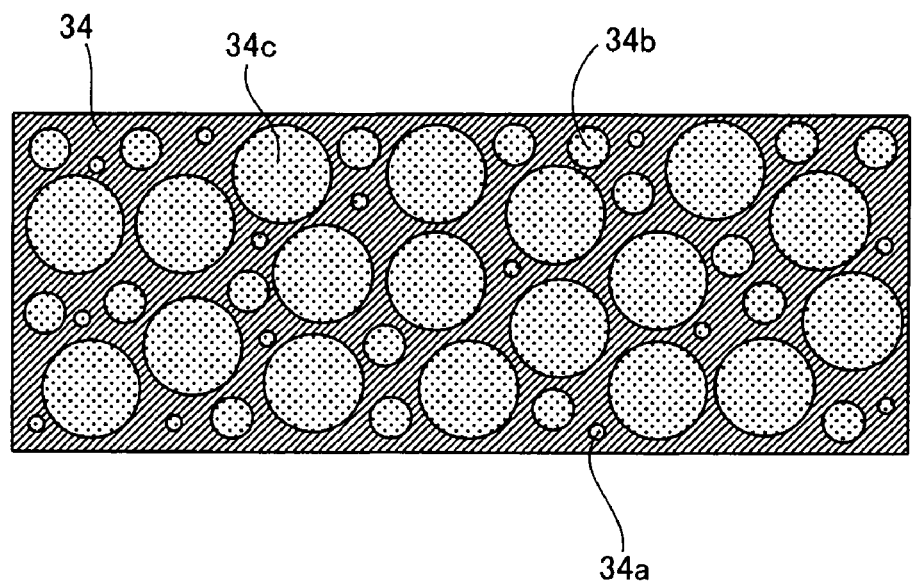
FIG. 20 is a schematic illustration of distribution of fillers filled into a second resin layer of the hybrid integrated circuit device according to the second embodiment shown in FIG. 17.
Figure 21:
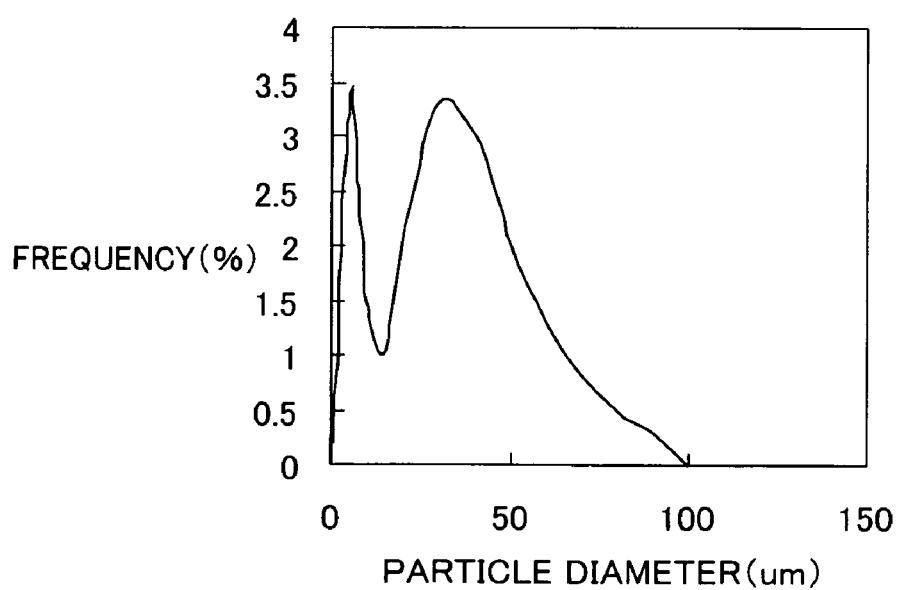
FIG. 21 is a graph showing the distribution of the fillers filled into the second layer in the hybrid integrated circuit device according to the second embodiment shown in FIG. 17.
Figure 22:
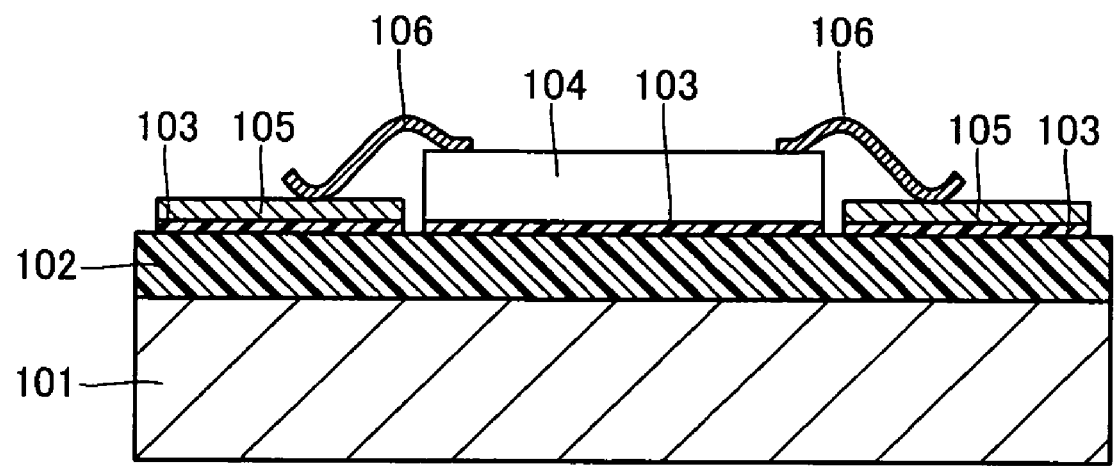
FIG. 22 is a sectional view schematically showing the structure of a conventional circuit device.

In the second embodiment, as shown in FIG. 20, fillers including at least fillers 34a, 34b and 34c corresponding to three average particle diameters different to one another are filled into the resin layer 34 at a weight filling factor of approximately 65%. Average particle diameters of the fillers 34a, 34b and 34c are respectively approximately 0.7 μm, approximately 10 μm, and approximately 45 μm. The filler 34a (average particle diameter: approximately 0.7 μm), the filler 34b (average particle diameter: approximately 10 μm), and the filler 34c (average particle diameter: approximately 45 μm) are filled into the resin layer 34 at frequencies shown in FIG. 21. More specifically, a compounding ratio of the fillers 34a, 34b and 34c is 2:4:4. As a material constituting the fillers 34a, 34b and 34c is used alumina ($Al_2O_3$) capable of improving a thermal conductivity of the resin layer 34. The fillers 34a, 34b and 34c are respectively examples of the "second filler", "third filler" and "first filler" according to the first embodiment.

In the second embodiment, the fillers 34a, 34b and 34c are used as described so that a Young's modulus (rigidity) of the second resin layer 34 is set to approximately 42050 MPa. In the second embodiment, the Young's modulus (rigidity) of the first resin layer 32 (approximately 38470 MPa) is set to be smaller than the Young's modulus (rigidity) of the second resin layer 34 (approximately 42050 MPa). The thermal conductivity and thermal expansion coefficient of the second resin layer 34 are respectively approximately 3.8 W/(m·K) and approximately 17 ppm/° C.

Further, in the second embodiment, as shown in FIG. 17, five via holes 34a having a diameter of approximately 70 μm and penetrating though the resin layer 34 are formed in predetermined regions of the resin layer 34 located on the lower side of the LSI chip 9. The five via holes 34a are respectively formed at positions corresponding to the five via holes 32a. The via hole 34a is an example of the "opening" and "second opening" according to the present invention. Further, in the resin layer 34, two via holes 34b having a diameter of approximately 70 μm and penetrating though the resin layer 34 are formed in regions corresponding to the wiring parts 3c of the conductive layer 3.

Further, a second conductive layer 5 formed from copper, having a thickness of approximately 15 μm, and including a thermal via part 5a, wire bonding parts 5b, and wiring parts 5c and 5d is formed in a predetermined region on the resin layer 34. The conductive layer 5 is an example of the "second conductive layer" according to the present invention. The thermal via part 5a is an example of the "second heat releasing part" according to the present invention. The wiring parts 5c and 5d are examples of the "second wiring part" according to the present invention. The thermal via part 5a of the conductive layer 5 is provided in a region on the lower side of the LSI chip 9 and has parts embedded in the via holes 34a so as to contact a surface of the thermal via part 3a of the conductive layer 3. The thermal via part 5a of the conductive layer 5 serves to transmit a heat generated in the LSI chip 9 to the thermal via part 3a of the conductive layer 3 so as to release the heat. The wire bonding parts 5b of the conductive layer 5 are provided in regions corresponding to the via holes 34b and have parts embedded in the via holes 34b so as to contact surfaces of the wiring parts 3c of the conductive layer 3. The wiring parts 5c of the conductive layer 5 are provided in regions on the lower side of the chip resistor 10. The wiring part 5d of the conductive layer 5 is provided in a region on a lower side of a lead 11.

The rest of the structure according to the second embodiment is the same as that of the first embodiment.

In the second embodiment, as described, the average particle diameters of the fillers 32a and 32b filled into the first resin layer 32 whose principle component is epoxy resin are respectively set to approximately 0.7 μm and approximately 3 μm, and the average particle diameters of the fillers 34a, 34b and 34c filled into the second resin layer 34 whose principle component is epoxy resin are respectively set to approximately 0.7 μm, approximately 10 μm and approximately 45 μm, so that the Young's modulus (rigidity) of the first resin layer 32 can be smaller than the Young's modulus (rigidity) of the second resin layer 34. Thereby, the first resin layer 32 having the smaller Young's modulus (rigidity) is deformed in such a manner as stretching together with the substrate 1 even though the first resin layer 32 formed on the substrate 1 is pulled by the substrate 1 when the substrate 1 expands due to the heat generated in the LSI chip 9 and the chip resistor 10. Accordingly, a tangential stress generated between the substrate 1 and the first resin layer 32 can be reduced. As a result, the first resin layer 32 can be prevented from peeling from the substrate 1. Further, even if the substrate 1 expands due to the heat generated in the LSI chip 9 and the chip resistor 10, the substrate 1 under the second resin layer 34 (first resin layer 32) can be prevented from warping because the Young's modulus of the second resin layer 34 is larger. Thereby, the deformation of the hybrid integrated circuit device can be controlled.

Further, in the second embodiment, as described, the first resin layer 32 is filled with only the fillers 32a and 32b corresponding to the relatively small average particle diameters, while the second resin layer 34 is filled with the filler 34a corresponding to the relatively small average particle diameter and the fillers 34b and 34c corresponding to the relatively large average particle diameters. Thus, the Young's modulus (rigidity) of the first resin layer 32 can be smaller than the Young's modulus (rigidity) of the second resin layer 34.

Further, in the second embodiment, as described, the compounding ratio of the filler 32a (average particle diameter: approximately 0.7 μm) and the filler 32b (average particle diameter: approximately 3 μm) filled into the first resin layer 32 is set to 2:8 so that any void too small for the filler 32b corresponding to the average particle diameter of approximately 3 μm to penetrate into can be filled with the filler 32a corresponding to the average particle diameter of approximately 0.7 μm. Thus, a filling factor of the fillers in the resin layer 32 can be increased. As a result, the thermal conductivity of the resin layer 32 can be increased, and a heat releasability of the resin layer 32 can be thereby improved.

In the second embodiment, as described, the second resin layer 34 is filled with the filler 34b corresponding to the average particle diameter (approximately 10 μm) whose dimension is between the average particle diameter of the filler 34a (approximately 0.7 μm) and the average particle diameter of the filler 34c (approximately 20 μm) so that a filling factor of the fillers in the second resin layer 34 can be prevented from decreasing. Thereby, a heat releasability of the resin layer 34 can be prevented from deteriorating.

Any other effect achieved by the second embodiment is the same as described in the first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to the hybrid integrated circuit device mounted with the LSI chip and the chip resistor in the aforementioned embodiment, the present invention is not restricted to this bus is also applicable to another type of hybrid integrated circuit device mounted with circuit elements other than an LSI chip and a chip resistor, or to a semiconductor integrated circuit device other than a hybrid integrated circuit device.

While the present invention is applied to the circuit device of the two-layer structure having the second insulating layer and the second conductive layer successively formed on the first conductive layer in the aforementioned embodiment, the present invention is not restricted to this but is also applicable to a circuit device having a single-layer structure. The present invention is further applicable to a circuit device having a third insulating layer and a third conductive layer further successively formed on a second conductive layer. The present invention is further applicable to a circuit device having a multilayer structure with at least four conductive layers and four insulating layers.

In the first embodiment, the layer including only the filler corresponding to the average particle diameter of approximately 1 μm, the layer including only the filler corresponding to the average particle diameter of approximately 10 μm, and the layer including only the filler corresponding to the average particle diameter of approximately 20 μm are provided in the resin layer in the order from the substrate side. However, the present invention is not limited thereto. A filler corresponding to an average particle diameter of not more than approximately 20 μm (for example, a filler corresponding to an average particle diameter of approximately 10 μm or approximately 1 μm) may be mixedly present in a layer including a filler corresponding to an average particle diameter of approximately 20 μm, or a filler corresponding to an average particle diameter of not more than approximately 10 μm (for example, a filler corresponding to an average particle diameter of approximately 1 μm) may be mixedly present in a layer including a filler corresponding to an average particle diameter of approximately 10 μm. In those cases, any void too small for the filler corresponding to the larger average particle diameter to penetrate into can be filled with the filler corresponding to the smaller average particle diameter. Therefore, a filling factor of the fillers in the resin layer can be increased. Thereby, a thermal conductivity of the resin layer can be increased, which leads to the improvement of a heat releasability of the resin layer.

What is claimed is:

1. A circuit device comprising:
   a substrate;
   an insulating layer formed on said substrate;
   a filler filled into said insulating layer;
   a conductive layer formed on said insulating layer; and
   a circuit element formed on said conductive layer, wherein
   an average particle diameter of said filler filled into said insulating layer is controlled so that a Young's modulus of a part of said insulating layer on a substrate side is smaller than a Young's modulus of a part of said insulating layer on an opposite side relative to said substrate side.

2. The circuit device as claimed in claim 1, wherein
   said insulating layer is constituted from a single layer, and the Young's modulus of the part of said one-layer insulating layer on said substrate side is smaller than the Young's modulus of the part of said one-layer insulating layer on the opposite side relative to said substrate side.

3. The circuit device as claimed in claim 2, wherein
   said insulating layer is filled with said fillers corresponding to a plurality of average particle diameters different to each another.

4. The circuit device as claimed in claim 3, wherein
   an average particle diameter of said filler filled into the part of said insulating layer on said substrate side is smaller than an average particle diameter of said filler filled into the part of said insulating layer on the opposite side relative to said substrate side.

5. The circuit device as claimed in claim 4, wherein
   said fillers filled into said insulating layer are distributed in such a manner that the average particle diameters of said fillers can be smaller from a conductive-layer side toward said substrate side.

6. The circuit device as claimed in claim 2, wherein
   openings each having an enough depth to reach a surface of said substrate are formed in regions of said insulating layer corresponding to a lower side of said circuit element, and
   said conductive layer on said insulating layer is formed so as to contact the surface of said substrate via said openings of said insulating layer.

7. The circuit device as claimed in claim 1, wherein
   said insulating layer includes:
   a first insulating layer having a first Young's modulus and formed on said substrate; and
   a second insulating layer having a second Young's modulus and formed on a surface opposite to said substrate on which said first insulating layer is formed, and
   said first Young's modulus of said first insulating layer is smaller than said second Young's modulus of said second insulating layer.

8. The circuit device as claimed in claim 7, wherein
said first insulating layer is filled with said fillers corresponding to a plurality of average particle diameters different to each other, and
said second insulating layer is filled with said fillers corresponding to a plurality of average particle diameters different to each other.

9. The circuit device as claimed in claim 8, wherein
of said fillers filled into said insulating layer, a filler corresponding to a largest average particle diameter is not filled into said first insulating layer but filled into said second insulating layer.

10. The circuit device as claimed in claim 9, wherein
said fillers filled into said second insulating layer includes at least:
a first filler corresponding to a first average particle diameter;
a second filler corresponding to a second average particle diameter smaller than said first average particle diameter; and
a third filler corresponding to a third average particle diameter having a dimension between said first average particle diameter and said second average particle diameter.

11. The circuit device as claimed in claim 8, wherein
of said fillers filled into said insulating layer, a filler corresponding to a smallest average particle diameter is filled into both of said first insulating layer and said second insulating layer.

12. The circuit device as claimed in claim 7, wherein
said conductive layer includes:
a first conductive layer formed between said first insulating layer and said second insulating layer; and
a second conductive layer formed on said second insulating layer, and
first openings each having an enough depth to reach a surface of said substrate are formed in regions of said first insulating layer corresponding to a lower side of said circuit element, and second openings each having an enough depth to reach a surface of said first conductive layer are formed in regions of said second insulating layer corresponding to the lower side of said circuit element,
said first conductive layer includes a first heat releasing part formed so as to contact the surface of said substrate via said first openings of said first insulating layer, and
said second conductive layer includes a second heat releasing part formed so as to contact the surface of said first conductive layer via said second openings of said second insulating layer.

13. The circuit device as claimed in claim 12, wherein
said first conductive layer includes a first wiring part in addition to said first heat releasing part, and
said second conductive layer includes a second wiring part in addition to said second heat releasing part.

14. The circuit device as claimed in claim 7, wherein
said first insulating layer and said second insulating layer contain a same material as principle components thereof.

15. The circuit device as claimed in claim 1, wherein
said insulating layer includes an insulating layer containing resin as a principle component thereof.

16. The circuit device as claimed in claim 15, wherein
said filler is formed from a material capable of increasing a thermal conductivity of said insulating layer.

17. The circuit device as claimed in claim 1, wherein
said substrate includes a substrate whose principle component is metal.

18. The circuit device as claimed in claim 1, wherein
said substrate includes a surface having a corrugated shape.

19. The circuit device as claimed in claim 1, wherein
said substrate includes:
a first layer having a first thermal expansion coefficient;
a second layer formed on said first layer and having a second thermal expansion coefficient different to said first thermal expansion coefficient of said first layer; and
a third layer formed on said second layer and having a third thermal expansion coefficient different to said second thermal expansion coefficient of said second layer.

20. The circuit device as claimed in claim 1, wherein
a surface of said substrate is oxidized or nitrided.

* * * * *